United States Patent

[11] 3,593,195

[72] Inventor Roy R. Shanks
Royal Oak, Mich.
[21] Appl. No. 767,994
[22] Filed Oct. 16, 1968
[45] Patented July 13, 1971
[73] Assignee Energy Conversion Devices, Inc.
Troy, Mich.

[54] OSCILLATOR CIRCUIT
4 Claims, 6 Drawing Figs.

[52] U.S. Cl. .... 331/107 R, 328/66, 331/96, 331/128
[51] Int. Cl. .... H03b 7/14
[50] Field of Search .... 307/287, 324; 331/111, 107, 126, 128, 129, 131; 328/66—68

[56] References Cited
UNITED STATES PATENTS
2,662,981 12/1953 Segerstrom .... 331/131
3,271,591 9/1966 Ovshinsky .... 307/258
FOREIGN PATENTS
644,899 10/1950 Great Britain .... 331/129

*Primary Examiner*—John Kominski
*Attorney*—Wallenstein, Spangenberg, Hattis and Strampel

ABSTRACT: An oscillator circuit using a symmetrical threshold semiconductor device as the active component, a resistance-reactance circuit for generating exponential waveforms and a time delay line to control the operation of the semiconductor device and resistance-reactance circuit.

Inventor
Roy R. Shanks

By: Wallenstein, Spangenberg, Hattis & Strampel, Attys

Inventor
Roy R. Shanks
By: Wallenstein, Spangenberg, Hattis & Strampel Attys.

OSCILLATOR CIRCUIT

This invention employs a new type of semiconductor device which is fully disclosed in U.S. Pat. No. 3,271,591 issued Sept. 6, 1966.

This invention relates generally to oscillator circuits and more particularly to oscillator circuits which use exponential increasing voltage signals for their operation. Specifically, this invention is directed to an oscillator circuit which is frequency and amplitude independent over a relatively wide range of supply voltage variations and which will operate substantially in the same manner and at the same frequency and amplitude regardless of the polarity of the potential applied to the power receiving terminal of the oscillator circuit.

Heretofore, relaxation oscillator circuits, of the simplest type, would employ switching devices of the PN junction type to control the discharge of a resistor-capacitor charging circuit. The frequency of oscillation of this type of circuit is dependent on, among other things, the characteristics of the switching device used and on the charging rate of the resistor-capacitor charging circuit.

The operating characteristics of individual switching devices of the same type may be different one from the other, but the operating characteristic of a particular device remains substantially constant throughout its useful operational life. Although the frequency of oscillation is dependent on the characteristic of the particular switching device used, the dependency is a fixed one, only being taken into consideration during the initial construction of the circuit. However, the charging rate of the charging circuit depends on the value of the components used in that circuit and on the potential of the voltage source applied thereto. Therefore, voltage variations within the power supply used to operate a relaxation oscillator have the disadvantage of causing corresponding variations in frequency and amplitude of the output signal produced by the oscillator circuit. If frequency and amplitude variations cannot be tolerated because of the particular requirements of the relaxation oscillator use, then voltage regulation devices are added to the power supply or the relaxation oscillator is not used at all but replaced with a more accurate and more expensive oscillator circuit. This results in limited use of inexpensive and simple relaxation oscillators.

Furthermore, prior art oscillators in general are not bipolarity devices. That is, oscillators of the prior art will operate only when the power receiving terminals of the oscillator are connected to a power source in a specific manner, plus terminal of the oscillator to the plus terminal of the power source and minus terminal of the oscillator to the minus terminal of the power source, and will not operate if the terminal connections are reversed.

Accordingly, one of the objects of this invention is to provide a novel relaxation oscillator circuit which is frequency and amplitude independent of voltage variations of the power source connected thereto.

Another object of this invention is to provide an improved oscillator circuit which is a bipolarity device and operates at the same frequency and amplitude regardless of the polarity applied to the power receiving terminals of the oscillator.

One feature of this invention is the use of a new type of symmetrical threshold-semiconductor switching device as the active element in a relaxation oscillator.

Another feature of this invention is the use of a time delay line as a passive element to control the frequency of oscillation of a relaxation oscillator.

Briefly, the oscillator circuit of this invention incorporates a resistor connected in series with a reactance component, as for example, a capacitor, to form a charging circuit. A symmetrical bidirectional two terminal threshold switching device has one terminal thereof connected to the circuit point joining the resistor and capacitor. The switching device is periodically rendered conductive to discharge the capacitor and produce oscillations. The other terminal of the switching device is connected to a time delay line, and a pulse generated by the discharge of the capacitor is sent through the delay line and reflected back from whence it came. This reflected pulse is combined with the charge of the capacitor to increase the voltage drop across the switching device above its threshold voltage to render the switching device conductive at a specific point in time to sustain oscillations at a fixed frequency and amplitude.

Accordingly, other objects, features and advantages will be more fully realized and understood from the following detailed description when taken in conjunction with the accompanying drawings wherein like reference numerals throughout the various views of the drawings are intended to designate similar elements or components.

Figure 1:
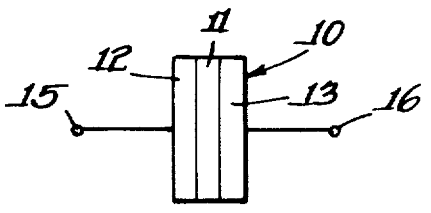
FIG. 1 is a diagrammatic illustration of the current controlling device which is used in this invention to control oscillations in a circuit.

Referring now to the diagrammatic illustration of FIG. 1, the current controlling device used in this invention is designated generally by reference numeral 10. It may be of the type referred to as a "Mechanism Device" in the aforementioned patent No. 3,271,591. It includes a semiconductor material 11 which is one conductivity type and which is of high electrical resistance and a pair of electrodes 12 and 13 in contact with the semiconductor material 11 and having a low electrical resistance of transition therewith. The electrodes 12 and 13 of the current controlling device 10 are used to connect the same in an electrical circuit by means of a pair of terminals 15 and 16 for applying power thereto. The current controlling device of FIG. 1 is a bidirectional switch and, therefore, the power supplied may be a DC voltage or an AC voltage as desired.

Figure 2:
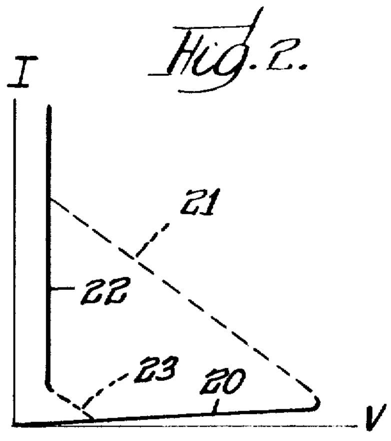
FIG. 2 is a voltage current curve illustrating the operation of the current controlling device of FIG. 1 when operated from a direct current voltage source.

FIG. 2 is an I-V curve illustrating the DC operation of the current controlling device 10 when connected to a suitable load. The device is normally in its high resistance condition and as an increasing DC voltage is applied to terminals 15 and 16, the voltage-current characteristics of the device are as illustrated by the curve 20, the electrical resistance of the device being high and substantially blocking the current flow therethrough. When the voltage is increased to a threshold voltage value, the high electrical resistance in the semiconductor material substantially instantaneously decreases in at least one path between the electrodes 12 and 13 to a low electrical resistance, the substantially instantaneous switching being indicated by the curve 21. This provides a low electrical resistance or conducting condition for conducting current therethrough. The low electrical resistance is many orders of magnitude less than the high electrical resistance. The conducting condition is illustrated by the curve 22 and it is noted that there is a substantially linear voltage-current characteristic and a substantially constant voltage characteristic which are the same for increase and decrease in current. In other words, current is conducted at a substantially constant voltage. In the low resistance current conducting condition the semiconductor material has a voltage drop which is a minor fraction of the voltage drop in the high resistance blocking condition near the threshold voltage value.

As the voltage is decreased, the current decreases along the line 22 and when the current decreases below a minimum current holding value, the low electrical resistance of said at lease one path immediately returns to the high electrical resistance blocking condition. The switching from the low resistance conducting condition to the high resistance blocking condition occurs along the curve 23.

Figure 3:
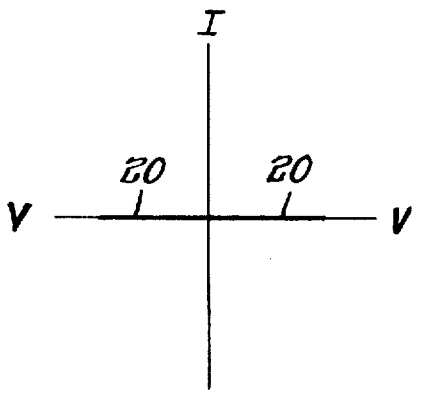
FIGS. 3 and 4 are voltage current curves illustrating the operation of the current controlling device of FIG. 1 when operated from an alternating current voltage source.
Figure 4:
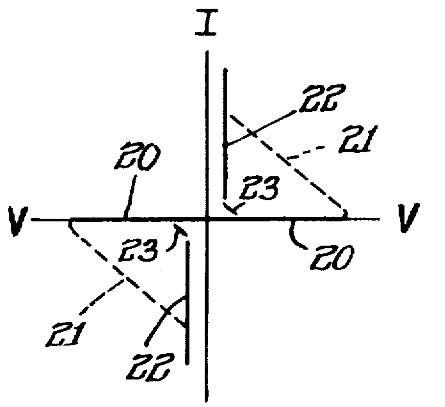

The current controlling device 10 used in this invention is symmetrical in its operation, it blocking current substantially equally in each direction and it conducting current substantially equally in each direction, and the switching between blocking and conducting conditions being extremely rapid. In the case of AC operation the voltage current characteristics for the second half cycle of the AC current would be in the opposite quadrant from that illustrated in FIG. 2 as in the reversal of DC polarity. The AC operation of the device is illustrated in FIGS. 3 and 4. FIG. 3 illustrates the device 10 in its blocking condition where the peak voltage of the AC voltage is below the threshold voltage value of the device, the blocking condition being illustrated by the curve 20 in both half cycles. When, however, the peak voltage of the applied AC voltage increases above the threshold value of the device, the device substantially instantaneously switches along the curves 21 to the conducting condition illustrated by the curves 22, the device switching during each half cycle of the applied AC voltages as illustrated in FIG. 4. As the applied AC voltage nears zero so that the current through the device falls below the minimum current holding value, the device switches along the curve 23 from the low electrical resistance condition to the high electrical resistance condition, illustrated by the curve 20, this switching occurring near the end of each half cycle.

For a given configuration of the device 10, the high electrical resistance may be about 1 megohm and the low electrical resistance about 10 ohms, the threshold voltage value may be about 20 volts and the voltage drop across the device in the conducting condition may be less than 1 volt, and the switching times may be in nanoseconds or less.

Figure 5:
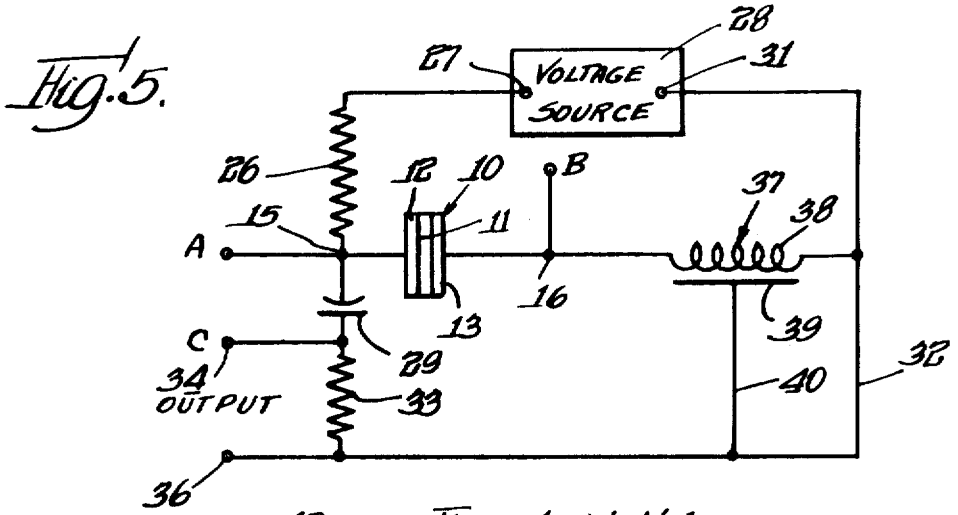
FIG. 5 is an oscillator circuit using the current controlling device of FIG. 1 and constructed to illustrate the novel features of this invention.

Now referring to FIG. 5 there is shown a relaxation oscillator circuit which is operated in a unique and novel manner and which utilizes to advantage the symmetrical switching characteristics of the current control device 10 of FIG. 1. A resistor 26 has one end thereof connected to the circuit point 15 and the other end thereof connected to a terminal 27 of a voltage source 28. A capacitive reactance element 29, has one end thereof connected to the circuit point 15 and the other end thereof connected to a terminal 34.

Interposed between terminal 34 and the line 32 is a resistor 33 which has a relatively low resistance value in contrast to the relatively high resistance value of resistor 26. Output signal information from the oscillator circuit is preferably taken from across the resistor 33 via a pair of terminals 34 and 36. As the resistor 33 is a relatively low resistance value, large loads connected to the output terminals 34 and 36 will not affect the operation of the oscillator circuit.

Connected to terminal 16 of the switching device 10 is one end of a time delay line 37. The other end of the time delay line 37 is connected to the line 32 which may be considered the common line of the circuit or ground potential. When the capacitor 29 charges sufficiently to render the switching device 10 conductive, a pulse is applied to the time delay line 37. This pulse travels along the time delay line for a predetermined period of time and when the pulse reaches the end of the line it is reflected back to terminal 16 from whence it came. Since the end of the delay line is terminated in a short, i.e. connected to a cọmmon line 32, the reflected pulse appearing at circuit point 16 is of opposite polarity with respect to the original pulse applied to the delay line. Because the pulse travels through the delay line in one direction and then is reflected in the opposite direction, the total time delay for the reflected pulse to appear at circuit point 16 is twice the time delay of the delay line 37. The delay line 37, may include one or more inductors indicated generally by reference numeral 38 and one or more capacitors indicated generally by reference numeral 39. The capacitor 39 has one end thereof connected to the common line 32 via a line 40.

Figure 6:
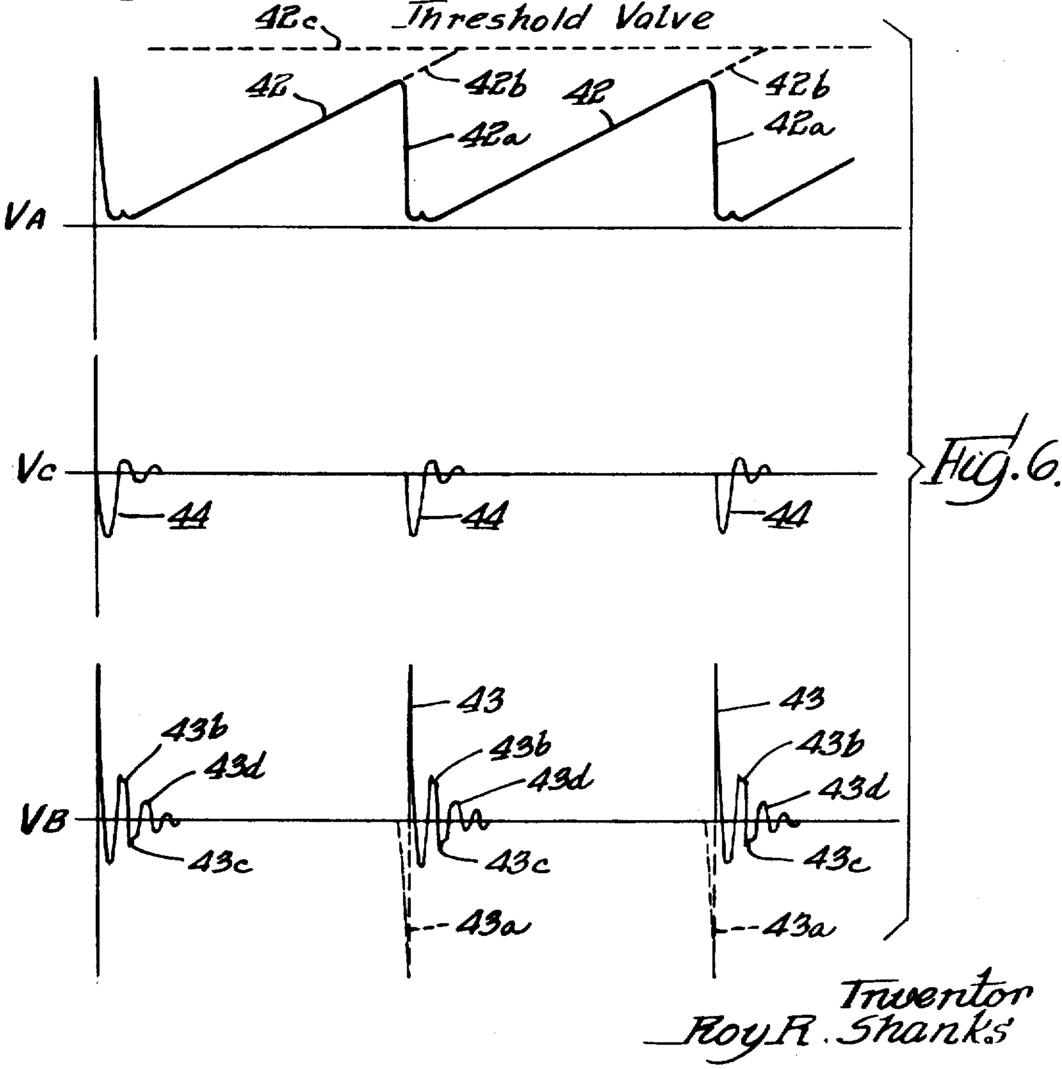
FIG. 6 is a series of waveforms taken from different circuit points of the oscillator shown in FIG. 5.

FIG. 6 illustrates a series of waveforms which appear at different circuit points of the oscillator circuit of FIG. 5. The sawtooth waveforms 42 illustrate the voltage pulse signal information appearing at terminal A of FIG. 5. The waveforms 42 illustrate the charging rate of the capacitor 29 in the substantially linear portion of the exponential curve. Also shown in broken lines is an extended portion **42*b* of the waveforms 42 that rises upwardly to the voltage threshold value 42*c* of the switching device 10. Waveforms 43 illustrate the voltage pulse generated by the discharge of capacitor 29 through the device 10 and the reflected pulse from the delay line 37 as they appear at terminal B of FIG. 5. Waveforms 44 illustrate the voltage pulse information appearing at terminal C, of FIG. 5**, which is also the preferred output signal of the oscillator circuit.

In operation, current from the voltage source 28 initially passes through the resistor 26 to charge the capacitor 29 until the voltage across the capacitor exceeds the threshold voltage value **42*c* of the switching device 10. That is, the first pulse of the series of waveforms 42 will rise to the threshold voltage value 42*c* of the switching device 10 as indicated by the broken line portions 42*b* of waveforms 42. At this time, the switching device 10 is rendered conductive to provide a low resistance discharge path for the capacitor 29 to discharge the capacitor into the delay line 37. The pulse so applied to the input of the delay line 37 is indicated by the positive spike portion of waveform 43. This pulse traverses the delay line 37 and arrives at the shorted end thereof in a predetermined period of time. By way of example, and not by way of limitation, the delay line may have a 1.8 microsecond delay. When the pulse reaches the end of the delay line 37 it is inverted in polarity as indicated in broken lines at 43*a* and reflected to appear at circuit point 16 from whence it came. The total delay in time of the pulse to traverse the delay line in both directions is 3.6 microseconds. The amplitude of the reflected pulse, in a lossless delay line, is theoretically double that of the input amplitude. However, due to finite losses in the delay line the pulse amplitude of the reflected signal 43*a*** is approximately equal to the input pulse amplitude.

After the rapid discharge of capacitor 29, as indicated by the fast fall **42*a* of the waveform 42, the holding current necessary to maintain conduction of the switching device 10 is reduced so that the switching device 10 will return to the cutoff condition. The resistor 26 may be selected sufficiently large to ensure that the current through the switching device 10 will go below the holding current after the capacitor 29** is discharged.

After the capacitor 29 is discharged and the switching device 10 is cutoff, the capacitor 29 is again charged through resistor 26. The RC time constant of resistor 26 and capacitor 29 is selected so that the voltage charge across the capacitor does not reach the threshold voltage value of the switching during a period of time equal to or less than twice the delay time of the delay line 37. However, after 3.6 microseconds has elapsed the reflected negative pulse **43*a* which appears at circuit point 16 is combined with the positive voltage charge 42 on the capacitor 29 and the summation of the two voltages appearing across the switching device 10 is sufficient to render the switching device conductive. That is, the negative spike 43*a* of waveform 43 is added to the corresponding positive waveform 42 at a point in time before the waveform 42 reaches the threshold voltage value 42*c* of the device 10 and it is the combined voltage of the spike 43*a* and the corresponding waveform 42 which render the switching device 10 conductive. This action will repeat every 3.6 microseconds and sustain oscillations of the circuit at a fixed frequency and amplitude. The relaxation oscillator shown in FIG. 5 will operate at a fundamental frequency which is determined by the time delay of the time delay line 37. The RC time constant of resistor 26 and capacitor 29 must be long enough so that the switching device 10 is rendered conductive in response to the reflected pulse 43*a* from the delay line 37 when combined with the voltage charge 42 on the capacitor. However, if the RC time constant is increased substantially it is possible for the reflected pulse to again traverse the delay line back and forth two additional cycles so that the oscillator will operate at the third harmonic frequency. In this instance the second of these reflected pulses has no affect on the switching device 10** as this pulse is of the same polarity as the charge voltage on capacitor 29 and when combined therewith the voltage applied across the switching device 10 is reduced.

Ideally, the waveform 43 should have a single positive pulse without ringing and a single reflected pulse 43*a* as shown in broken lines. This may be brought about or closely approximated by using a low Q delay line 37. However, the waveform 43 may have considerable ringing or diminishing oscillations 43*b*, 43*c* and 43*d* which follow the rapid cut off of the switching device 10 when the current therethrough decreases below the minimum current holding value. If the first positive pulse 43*b* following shutoff the shutoff 10, is small enough so that the voltage drop across the device is less than the existing threshold voltage value of the device, the device will remain in its shutoff condition until the next cycle of operation. However, if the first positive pulse 43*b* should be high enough, the device 10 will fire in the reverse direction as indicated by the spike in oscillation 43*b* but will immediately shutoff due to decrease in current. Also, if the second negative pulse 43*c* should be high enough, the device 10 will fire in the forward direction as indicated by the spike in oscillation 43*c* but will immediately shutoff due to decrease in current. By the time the third oscillation 43*d* appears, the voltage drop across the device 10 will not be greater than the then existing threshold voltage value of the device so that the device will no longer switch to its conducting condition until the next cycle of operation. The period of the ringing or oscillations 43*b*, 43*c*, or 43*d* are extremely short compared to the timing period of the delay line 37 so that they have no affect upon the fixed frequency operation of the oscillator circuit. Thus, the switching device 10 is rendered conductive for brief intervals during the oscillations 43*b* and 43*c* but the third oscillation 43*d* aids in finally maintaining the switching device 10 nonconductive since the oscillation 43*d* is below the then existing threshold voltage value and of the same polarity as the voltage applied to the capacitor 29. If the first oscillation 43*b* is made sufficiently small in amplitude, below the then existing threshold voltage value of the switching device 10, as for example, by using a low Q time delay line, it will then be the first oscillation that aids in maintaining the switching device 10 nonconductive. This feature allows the charging resistor 26 to have a lower resistance value than would otherwise be necessary to decrease the current flow through the switching device 10 below the minimum current holding value. This feature increases the power output capabilities of the circuit.

The waveforms 44 have a voltage amplitude proportional to the discharge current of the capacitor 29 as developed across resistor 33. As mentioned hereinabove, the output is preferably taken across resistor 33 thereby allowing relatively large loads to be connected to the oscillator circuit without effecting the operation of the circuit.

Since the frequency of oscillation of the circuit of FIG. 5 is dependent on the time delay of the time delay line 37, the potential of the voltage source 28 may vary over a wide range of potentials so long as the sum of the charging positive voltage on capacitor 29 and the reflected negative pulse on delay line 37 is sufficient to render the switching device conductive. Furthermore, the circuit of FIG. 5 will operate equally well regardless of the polarity of potential applied to the circuit. That is, terminal 27 may be positive and terminal 31 may be negative to produce the wave shapes shown in FIG. 6. However, terminal 27 may be negative and terminal 31 may be positive to produce wave shapes opposite in polarity to that shown in FIG. 6. In either instance, the circuit will oscillate at the same frequency and amplitude.

Although I have disclosed the novel concepts of my invention in conjunction with a relaxation oscillator it is apparent that the switching device 10 and the delay line 37 may be used as described herein to control the operation of any type of oscillator circuit which uses a voltage increasing with time as one of the operating characteristics such that the voltage increasing with time is combined with a reflected pulse from the delay line 37 to apply a potential across the switching device 10 sufficient to render the switching device 10 conductive.

Furthermore, the oscillator circuit of this invention provides means whereby the oscillator circuit operates as a bipolarity device, and the oscillation frequency and amplitude is substantially independent of variations of potential of the applied voltage source.

Accordingly, it will be understood that variations and modifications may be effected without departing from the spirit and the scope of the novel concepts of this invention.

I claim:

1. An oscillator circuit for generating periodic signals comprising: voltage generating means for generating a control voltage progressively increasing from an initial value to a given larger value unless reset prior to reaching said larger value; a two terminal threshold switch means having a pair of terminals coupled to the output of said voltage generating means and adapted to be rendered conductive when the voltage applied to said terminals reaches a threshold value of said switch means which is at or below said given larger value, said conductive condition persisting until the current flow therethrough drops below a given minimum current holding value, the initiation of conduction of said switch means developing a pulse and resetting said voltage generating means so the voltage output progressively increases once again from said initial value, and delay line means having an unshunted input connected with said switch means terminals and a shorted output to reflect the initial pulse generated by conduction of the switch means at the input thereof, the reflected pulse upon reaching said unshunted input providing a voltage which adds to the increasing voltage fed to said terminals from said voltage generating means to provide a resultant voltage across said terminals at or above said threshold value, to again render said threshold switch means conductive, and to initiate another cycle of operation of the oscillator circuit.

2. The oscillator circuit of claim 1 wherein said voltage generating means includes resistance means, reactance means connected in series with said resistance means to form a circuit point therebetween, and a DC voltage source having first and second terminals across which a DC voltage appears, means connecting the end of said resistance means remote from said circuit point to the first terminal of said voltage source, and means connecting the end of said reactance means remote from said circuit point to the second terminal of said voltage source; the unshunted input to said delay line means including a first pair of input terminals; one of said terminals of said switch means is connected to the circuit point formed between said resistance means and said reactance means and the other terminal thereof is connected to one of said input terminals of said delay line means, the other input terminal of said delay lines means is coupled to said end of said reactance means remote from said circuit point, the initial storage of electrical energy in said reactance means effecting momentary conduction of said switch and the release of energy from said reactance means to the input terminals of said delay line means to pulse the same, the reflected pulse arriving at said input terminals driving said switch means again into momentary conduction to initiate another cycle of operation.

3. An oscillator circuit for generating periodic signals comprising: voltage generating means for generating a control voltage progressively increasing from an initial value to a given larger value unless reset prior to reaching said larger value; a two terminal threshold switch means having a pair of terminals coupled to the output of said voltage generating means and adapted to be rendered conductive when the voltage applied to said terminals reaches a threshold value of said switch means, which is at or below said given larger value, said conductive condition persisting until the current flow therethrough drops below a given minimum current holding value, the initiation of conduction of said switch means developing a pulse and resetting said voltage generating means so the voltage output progressively increases once again from said initial value; and delay line means having an input connected with said switch means terminals and an output to reflect said pulse which, after traversing said delay line means, provides at said switch means terminals a voltage less than said threshold value which adds to the increasing voltage fed to said terminals from said voltage generating means to provide a resultant voltage across said load terminals at or above said threshold value, to again render said threshold switch means conductive, and to initiate another cycle of operation of the oscillator circuit, said delay line means acting as a high Q inductance-capacitance circuit shock excited by the application of said pulse to produce decaying pulses of alternating polarity one of which aids in rendering the switch means nonconductive after being triggered into a conductive state by reducing the current flow therethrough below said minimum current holding value, the pulsations lasting for only a fraction of the duration of each cycle of operation of the oscillator.

4. The oscillator circuit of claim 3 wherein said voltage generating means includes resistance means, reactance means connected in series with said resistance means to form a circuit point therebetween, and a DC voltage source having first and second terminals across which a DC voltage appears, means connecting the end of said resistance means remote from said circuit point to the first terminal of said voltage source, and means connecting the end of said reactance means remote from said circuit point o the second terminal of said to source; the unshunted input to said delay line means including a first pair of input terminals; one of said terminals of said switch means is connected to the circuit point formed between said resistance means and said reactance means and the other terminal thereof is connected to one of said input terminals of said delay line means, the other input terminal of said delay line means is coupled to said end of said reactance means remote from said circuit point, the initial storage of electrical energy in said reactance means effecting momentary conduction of said switch and the release of energy from said reactance means to the input terminals of said delay line means to pulse the same, the reflected pulse arriving at said input terminals driving said switch means again into momentary conduction to initiate another cycle of operation, and said resistance means being of a value less than that necessary to reduce the current of said switch means below said minimum current holding value in the absence of said shock excited pulses.